(12) United States Patent
Petrescu-Prahova (10) Patent No.: US 6,272,161 B1
(45) Date of Patent: Aug. 7, 2001

(54) HIGH POWER DIODE TYPE LASER DEVICES

(76) Inventor: Iuliah Basarab Petrescu-Prahova, Aleea Poiana Cermei No 4, Bl. Eh, AP.39, Bucharest (RO), 773211

(*) Notice: Subject to any disclaimer, the term of this patent is extended or adjusted under 35 U.S.C. 154(b) by 0 days.

(21) Appl. No.: 09/248,550

(22) Filed: Feb. 8, 1999

Related U.S. Application Data (63) Continuation of application No. PCT/RO98/00007, filed on Jun. 9, 1998.

(30) Foreign Application Priority Data

Jun. 9, 1997 (RO) .................................................. 97-010136

(51) Int. Cl.[7] ......................................................... H01S 5/16
(52) U.S. Cl. ................................................. 372/46; 372/45
(58) Field of Search ........................................ 372/46, 45

(56) References Cited

U.S. PATENT DOCUMENTS 5,737,351 * 4/1998 Ono .......................................... 372/45
5,745,517 * 4/1998 Bour et al. ............................... 372/45
5,953,358 * 9/1999 Ishikawa et al. ........................ 372/46

* cited by examiner

*Primary Examiner*—James W. Davie
(74) *Attorney, Agent, or Firm*—Thomas R. Vigil (57) ABSTRACT

Diode type laser devices (diode layers) with nonabsorbing windows that are obtained in low confinement asymmetric structures, that consist of a waveguide and an active region, the action region being situated asymmetrically relative to the waveguide, at an extremity of the waveguide central layer, outside, at the margin or inside the waveguide central layer. The nonabsorbing mirrors can be obtained by the partial etching of the diode lasers layered structures, by this etching the active region being removed but in a large extent the layered structure remaining unaffected, and by the regrowth of a material with an adequate crystalline structure and nonabsorbing for the radiation emitted by the laser. By such a process the optical properties of the waveguide are reconstructed in a large extent, so that the radiation propagates to the mirror into a waveguide similar with the waveguide of the rest of the laser.

12 Claims, 6 Drawing Sheets

The etching and the regrowth of the confinement layers 10'p and 10'n

Fig. 1 A multilayer structure

Fig. 2 A possible variation of the refractive index

Fig. 3 The etching and the regrowth of a confinement layer 10'

Fig. 4 The structure without a separation layer

Fig. 5 The structure with the active region included in the central layer of the waveguide Fig. 6 The etching and the regrowth of the confinement layers 10'p and 10'n

HIGH POWER DIODE TYPE LASER DEVICES

This application is a continuation of international application number PCT RO/98/00007, filed Jun. 9, 1998, (status, abandoned, pending, etc.).

CROSS-REFERENCE TO RELATED APPLICATIONS

This application is a continuing application of PCT Application No. PCT/RO 98/00007 filed Jun. 9, 1998 which claims priority from Romanian Patent Application No. 97-01036 filed Jun. 9, 1997.

The invention refers to diode type laser devices with an asymmetrical construction and with a reduced confinement factor having non absorbing windows.

It is known that the window catastrophic degradations and the gradual degradation of diode type laser devices, oscillators and amplifiers, in short diode lasers, represent important factors that are limiting these lasers operation at high power and high power density of the radiation that traverse the exit window. The catastrophic degradation is practically instantaneous when the power and the power density of the radiation, emitted at the mirror through the active region, overpass certain threshold values. The threshold values for the power density of the emitted radiation that passes through the active region and produce catastrophic degradation (the level for the catastrophic degradation) are in a great extent material characteristics. The catastrophic degradation level is lower for active regions obtained from materials that contain Al, for example AlGaAs, InGaAlP, or other materials, and is greater for active regions that do not contain Al, for example InGaAs, InGaAsP, or other materials. In some cases, the gradual degradation starts from mirror, having in the end, after a time period, the same effects as the catastrophic degradation, i.e. the irremediable destruction of the mirrors and of the laser. To avoid the catastrophic degradation the laser operation at power and power density levels a few time less than the catastrophic degradation level is recommendable.

The catastrophic degradation is produced by electronic states at the exit windows surface, surface states that modify the distribution of the electrical potential and the light absorption phenomena in the superficial layer at the semiconductor material—external medium interface. To remedy the effects induced by these surface states several solutions for obtaining windows for diode laser were imagined.

There are known diode lasers whereat the surface of the diode laser window, defined as the interface between the semiconductor material of the type $A_3B_5$, $A_2B_6$, or other semiconductor materials and the external medium, most frequently the surrounding air, is covered with thin layers of other materials. There are such proposals for mirror covering with different types of oxides, including the natural oxides of the semiconductor materials of the laser structure. The disadvantage of the oxide covering is that usually they do not produce the highest catastrophic degradation level. There are proposals for mirror covering with other semiconductor materials, transparent to the laser emitted radiation, for example with ZnSe. Although it produces a very high catastrophic degradation level, the disadvantage of this method is that, in order to have the highest efficiency and reliability, the deposition of other semiconductor materials need to be done in very clean conditions, for example by cleaving the mirrors in very high vacuum and by their immediately covering in this high vacuum conditions. The semiconductor material used for covering regularly is polycrystalline, the choice of the deposition conditions being such as to assure a composition close to the stoichiometric composition.

There are also known diode lasers whereat the mirror surface is covered with semiconductor materials from the same family as the semiconductor materials that form the multilayer structure of the diode laser, for example a material of the type $Al_xGa_{1-x}$. As in the case of a structure obtained from layers in the $Al_x$, $Ga_{x-1}$. As system, or a material of the type in $In_xGa_{1-x}As_yP_{1-y}$, in the case of structures obtained from layers in the $In_xGa_{1-x}As_yP_{1-y}$, system, or other materials in other similar systems. In all cases the covering material has the energy gap higher than the energy gap of the active layer, in order to be transparent to the laser emitted radiation. In this solution the covering semiconductor material is of monocrystalline type, with the same type of crystalline structure as the materials that form the laser structure, what assure a minimum of interface states. To deposit this covering semiconductor material, in the semiconductor wafer that contains the laser structure, through narrow etching windows formed in the approximate place where the future mirror will be, the laser structure consisting of the active region and the other layers of the waveguide is etched and the new covering material is deposited instead of the etched material. The etching—deposition process can be a continuous process, for example by etching in Ga or In solution, with immediate regrowth from the same solutions of a material of the AlGaAs,InGaP, or other material type. The disadvantage of this method is that in order to etch the active region and to replace it with other semiconductor material, the entire waveguide is affected and the waveguide is interrupted at the etching—regrowth interface, to a certain distance from the exit window surface. If the etching stripe is narrow (a few micrometers) so that the radiation that quits the interrupted guide arrives at the mirror and is back reflected by the mirror toward the interrupted guide can be in a large degree captured by the interrupted guide, then the effective reflection coefficient can be sufficiently large, in order to assure the necessary feedback for the operation as an oscillator, and the losses, inside the device but external to the waveguide, can be sufficiently low. If the etching stripe is large (tens of micrometers) the losses outside the guide are relatively large. In this latter case, the divergent beam that leaves the waveguide can reach, when propagating, the surface of the closest metallic contact and be lost there, or, when it reaches the mirror surface can have a large cross section, larger than the cross section of an possible fiber to be coupled with. A narrow etching stripe, with a pronounced profile in depth, has the disadvantage that is more difficult to be obtained into practice, the regrowth processes are more difficult and the further cleaving inside of a narrow stripe is more difficult. A wide etching stripe has the disadvantage that increases the losses inside the device and the coupling losses and reduces the effective reflection coefficient.

INVENTION SUMMARY

The problem solved by this invention is the achievement of nonabsorbing windows, with a reduced number of surface states that do not interrupt essentially the propagation properties of the waveguide.

The windows for diode type laser devices according to the invention avoid the disadvantages of other known solution since:

they are obtained in asymmetric, low confinement factor structures that consists of a waveguide formed of several semiconductor layers with selected optical properties and an active region where the generation of the radiation is produced, the active region being located asymmetrically relative to the waveguide, at an extremity of the waveguide central layer, outside, at the margin or inside the waveguide central layer, they are obtained by the partial modification of the layered diode laser structure, into a stripe placed perpendicular to the direction of propagation, by this modification a large part of the layer structure remains unaffected, and a material with an adequate crystalline structure and nonabsorbing for the radiation emitted by the laser is put in place, such that the optical properties of the waveguide are reconstructed into a great extent, so that the radiation is propagating up to the mirror into a waveguide similar to the waveguide of the rest of the diode laser.

The diode lasers with non absorbing windows, according to the invention, have the following advantages:

the layered structure proper for the partial replacement of some layers, without an essential change of the waveguide, are low confinement structures which can operate at very high power densities and output powers;

the replacement material is crystalline and has similar properties with the replaced material, a fact that induces a minimum number of interface states at the interface between the unetched material and the regrown material;

the light propagation up to the cleaved surface is done without radiation losses or coupling losses with the rest of the diode laser, unmodified guide;

in the same process can be obtained both windows with proper optical properties and the stripe for the longitudinal propagation;

in the case of an etching-regrowth process, the composition of the active layer can be by itself an indicator for the immediate ceasing of the etching.

In the following, examples for the accomplishment of the invention will be given, in connection with FIG. 1 ... 6, that represent.

INVENTION DESCRIPTION

Figure 1:
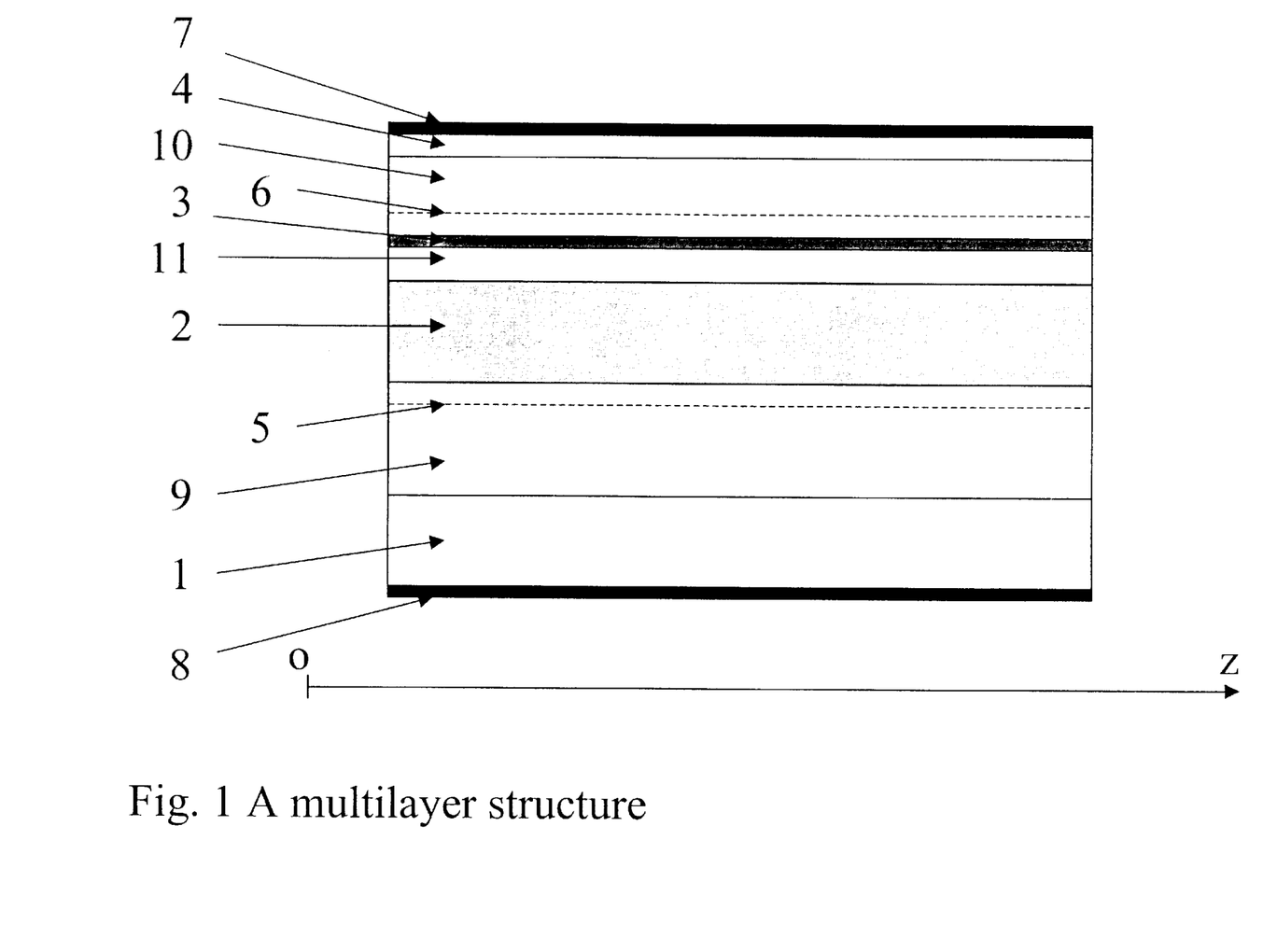
FIG. 1 A multilayer structure

The windows for diode type laser devices according with the invention are obtained in an asymmetric structure similar to that described in FIG. 1, formed from several layers on a substrate 1, among these layers some represent the waveguide central region 2, lightly shadowed in FIG. 1, some others represent the active region 3, stronger shadowed in FIG. 1. The structure with several layers ends with a final contact layer 4. The radiation is produced mostly in the active region by the combination of the pairs of opposite sign charge carriers, electrons and holes, injected from injection interfaces, among them one, 5, (represented by a dashed line) is of a first type of conductivity, at this interface one of the adjacent layer having that type of conductivity and the other 6, (represented also by a dashed line) is of the other type of conductivity, at this interface one of the adjacent layer having that other type of conductivity. The injection interfaces 5 and 6 are situated on one end on the other side of the active region 3 and may contain between them an undoped or intrinsic region. If the undoped or intrinsic region is missing, having a zero thickness, the active region should be sufficiently close to the surfaces 5 and 6, in this case overlapped, on one or on the other side of the single resulted interface, such as the injection of minority carriers in the active region to be efficient. The active region contain layers that have the smallest band gap among the layers situated between the injection interfaces 5 and 6 or in the region of efficient injection of the minority carriers. The active region 3 and one of the injecting layers, 5 or 6, are situated asymmetrically relative to the central region of the waveguide 2, closer to the final contact layer 4. The final contact layer is followed by a corresponding metal contact 7. On the other side of the substrate, relative to the multilayer structure, is situated the other metal contact 8. Using these two metal contacts 7 and 8 an electrical, bias U is applied to the structure, what produces the flow of an electrical current, 1.

The waveguide consists of several layers, essential being the substrate confinement layer 9, the final contact confinement layer 10 and the waveguide central layer, or the central region of the waveguide, 2, situated between the confinement layers 9 and 10. With reference to an orthogonal system Oxyz, the layers of the multilayer structure are parallel with the plane yOz and the radiation propagates in the longitudinal direction Oz. The Ox direction, perpendicular to the plane yOz is the transversal direction. The refractive index of the central layer 2 of the waveguide is, for the laser radiation in propagation, higher than the refractive indexes of the confinement layers 9 and 120. If the refractive indexes of the confinement layers 9 and 10 are not equal, is possible a tendency for a monotonous decrease of the refractive index of the confinement layers 9 and 10, from the extremity near substrate of the substrate confinement layer toward the extremity near final contact layer of the final contact confinement layer 10. If the confinement layer 10 has a refractive index variable in the transversal direction, its highest refractive index is smaller or equal to the smallest refractive index of the substrate confinement layer 9. In the transversal direction the maximum of the field distribution is attracted toward the waveguide central layer 2 by the bump formed by its refractive index, relatively higher than the refractive indexes of adjacent layers and is repelled from the confinement layer 10 toward the central layer by the mentioned decreasing variation of the refractive indexes of the confinement layers 9 and 10, that will be named in short optical wall effect.

Figure 2:
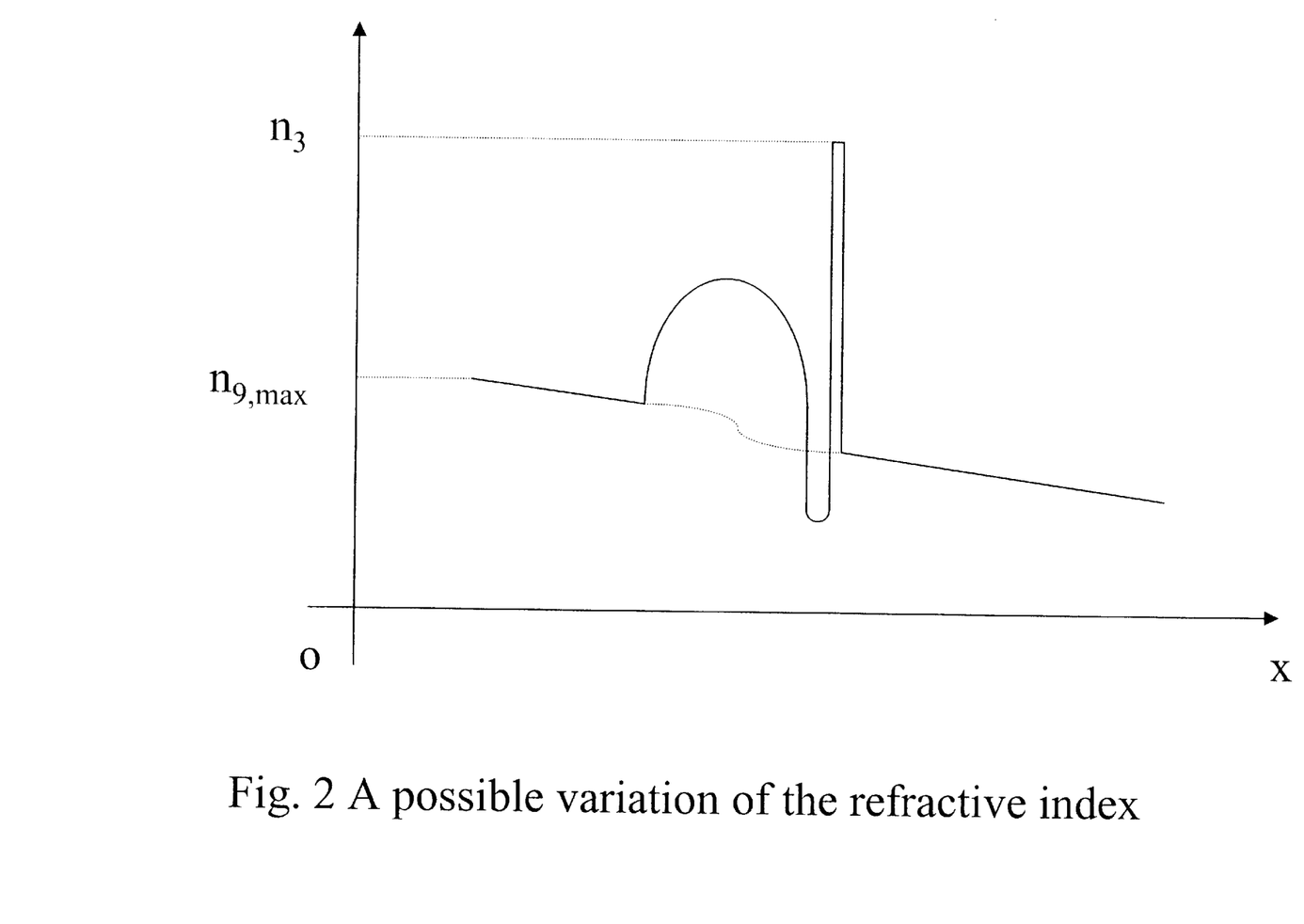
FIG. 2 A possible variation of the refractive index

In FIG. 1 structure, the active region 3 is separated from the waveguide central region 2 by a separation layer 11. The refractive index of the separation layer has an intermediary value between the minimum value of refractive index of the substrate confinement layer 9 and the maximum value of the final contact confinement layer 10, or may have a value lower than the refractive index values of the substrate confinement layer and final contact confinement layer in the points neighbor to the separation layer. In any case, if the confinement layers refractive indexes are not constant and equal one to the other, it need to be preserved a general possible decreasing tendency for the refractive indexes of the substrate confinement layer 9 and final contact confinement layer 10, from the extremity toward substrate of the substrate confinement layer toward the extremity toward final contact layer of the final contact confinement layer 10. In FIG. 2 is described a possible variation of the refractive index into a structure with separation layer. The refractive indexed are named corresponding to the layer to whom they are related, such that $n_9$ is the refractive index of the substrate confinement layer 9, $n_{9,max}$ is the maximum value of the refractive index of the substrate confinement layer 9, etc. With a doted line is described the mentioned decreasing general tendency, that is excluding the central and active region bumps and a possible well related to the separation region. The described structure, due to their asymmetrical construction and the selection of the optical and geometrical properties of the constituting layers, is characterized by the fact that the maximum of the radiation field distribution is attracted toward the middle of the waveguide central layer 2 and pushed from the active region 3, where the radiation is produced. The selection of the optical and geometrical properties of the waveguide central region and of the active region refers to the magnitude of these regions bumps relative to the highest refractive index $n_{9,max}$ of the substrate confinement layer 9, and to the repelling of the maximum of the radiation field distribution toward the central region 2 by an optical wall that can be built from or inside the confinement layer 10.

The bump magnitude, either that of the waveguide central region 2, formed between the substrate confinement layer 9 and the separation layer 11, or that of the active region 4, formed between the separation layer 11 and the confinement layer 10, is defined as being equal to the sum of elementary regions thickness in these bumps $\Delta x$, multiplied with the square root of the difference between the square of the refractive index of each elementary region and the square of the refractive index $n_{9max}$:

$$\text{bump magnitude} = \Sigma(n^2 - n_{9,max}^2)^{1/2} \Delta x$$

In order that the structure with several layers to accept only the transversal fundamental mode, the sum of the bump magnitudes need to be less than $\lambda/4$, whereas $\lambda$ is the vacuum wavelength of the laser radiation. In order that the maximum of the radiation field distribution to be attracted toward the middle of the central layer 2, the bump magnitude of the waveguide central region 2 is, usually, much larger than the bump magnitude of the active region 3.

Figure 3:
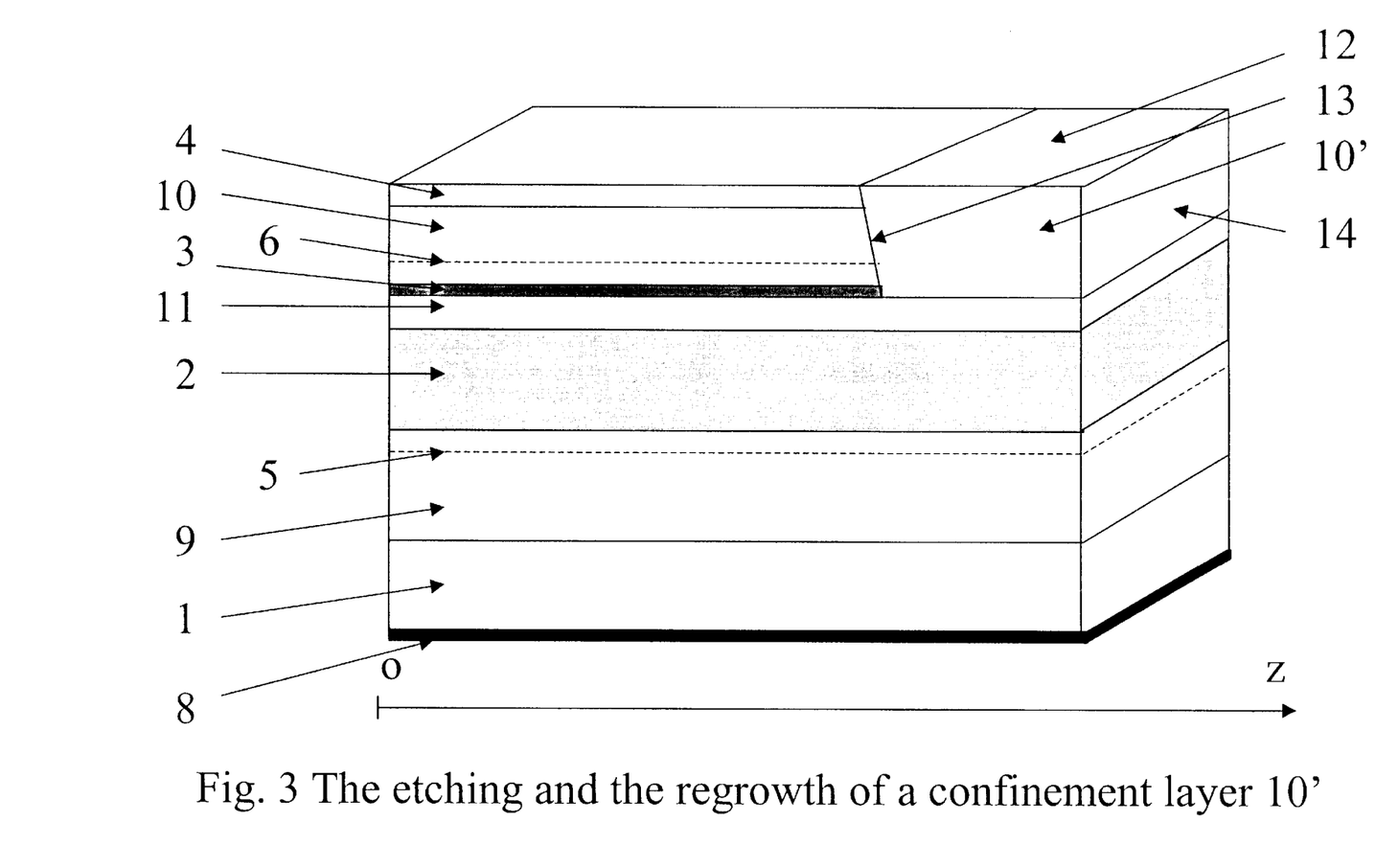
FIG. 3 The etching and the regrowth of a confinement layer 10'

To form the windows, the asymmetrical structure is partially modified into a window region 12, situated in a stripe perpendicular to the propagation direction Oz as shown in FIG. 3. By this modification the active region 3 is replaced but the waveguide central region 2 is preserved intact. After the modification, a confinement layer 10' is put in place, this layer being similar in properties with the previous confinement layer 10. As a consequence of the processes, along the laser there are two waveguide structures, the original structure and the modified structure. These two structures are separated from each other by a separation wall 13. The regrown structure is separated from the external medium by an exit window 14.

For structures with planar layers, that are not delimited or modified in the lateral direction Oy, the modes that propagate along the propagation direction Oz are characterized by a radiation field distribution in the transversal direction Ox, a distribution described by the function $E(x)$. In the direction Oy the $E(x)$ function is assumed constant. The propagation modes are different for the original structure and for the modified structure. They differ by the radiation field distributions, noted with $E(x)$ and $E'(x)$, and by the effectively refractive index for the propagation in the direction Oz, noted $n_{ef}$ and $n'_{ef}$. The asymmetrical structures according with the invention are characterized by the fact that these two distribution functions are very similar to each other and that the effective refractive indexes have close values.

A measure of the similarity degree for the distribution functions is the overlapping coefficient defined as:

$$\text{overlapping coefficient} = |\Sigma E''(x) \cdot E'(x) \Delta x|$$

where was considered that the distribution functions $E(x)$ and $E'(x)$ are normalized to unity.

An overlapping coefficient close to unity assures reduced losses for the propagating modes when passing through the separation surface 13, so that the radiation propagating in the fundamental mode of the original layered structure continues to propagate almost entirely in the fundamental mode of the modified layered structure.

Close values for the effective reflective indexes assure a minimal reflection of the radiation at the separation interface 13.

The interface 13 being a separation interface between two semiconductor materials very similar to each other, the surface states on the interface 13 are minimal, what assures a high level for the active region power density that produces the catastrophic degradation. At the exit window 14, whereat there is no active region, the power density that produce the catastrophic degradation is even higher.

In table 1 a structure obtained from materials in the $Al_xGa_{1-x}As$ system, having a separation layer, is presented while in table 2 a structure obtained from materials in the InGaAsP system, having a separation layer, is presented. The refraction indexes correspond to the radiation emitted in the active region. In these tables are presently only the confinement factors, or gamma factors, for the active region. The confinement factor values, 1.02%, respectively, 1.03% are smaller than the confinement factors for the separate confinement commercial heterostructures (SCH). The window region can be obtained by an etching regrowth process. By etching—regrowth, the layers written in shadowed rows of the table are placed with regrown confinement layers 10'. These layers can have a composition identical with the composition of the etched confinement layer 10 or can have close compositions, but selected.

By the etching and the regrowth of a confinement layer 10, with the composition identical to that of the etched layer 10, layered structures are obtained for which the radiation field distribution functions have overlapping coefficients equal to 0.9989, respectively 0.9968, and the effective refractive indexes change from 3.33716 to 3.3688, respectively from 3.2241 to 3.2193.

TABLE 1

| No. | Name | Number in the text | Composition index, x | Thickness ($\mu$m) | Refractive index | Confinement factor (%) |
|---|---|---|---|---|---|---|
| 1 | substrate | 1 | 0.00 | 100 | 3.64 | |
| 2 | confinement | 9 | 0.40 | 1.50 | 3.35 | |
| 3 | central | 2 | 0.30 | 0.25 | 3.42 | |
| 4 | separation | 11 | 0.40 | 0.10 | 3.35 | |

TABLE 1-continued

| No. | Name | Number in the text | Composition index, x | Thickness ($\mu$m) | Refractive index | Confinement factor (%) |
|---|---|---|---|---|---|---|
| 5 | active | 3 | 0.00 | 0.01 | 3.64 | 1.02 |
| 6 | confinement | 10 | 0.40 | 1.50 | 3.35 | |
| 7 | final contact | 4 | 0.00 | 0.10 | 3.64 | |

TABLE 2

| No | Name | No in text | Composition | Gap $E_g$ (eV) | Thickness ($\mu$m) | Refractive index | Confinement factor (%) |
|---|---|---|---|---|---|---|---|
| 1 | substrate | 1 | GaAs | 1.43 | 0.00 | 3.55 | |
| 2 | confinement | 9 | $In_{0.49}Ga_{0.51}P$ | 1.90 | 1.50 | 3.20 | |
| 3 | central | 2 | InGaAsP | 1.77 | 0.30 | 3.27 | |
| 4 | separation | 11 | $In_{0.49}Ga_{0.51}P$ | 1.90 | 0.10 | 3.20 | |
| 5 | active | 3 | $In_{0.2}Ga_{0.8}As$ | 1.26 | 0.01 | 3.70 | 1.03 |
| 6 | confinement | 10 | $In_{0.49}Ga_{0.51}P$ | 1.90 | 1.50 | 3.20 | |
| 7 | final contact | 4 | GaAs | 1.43 | 0.10 | 3.55 | |

Beside the multilayer structure that has a separation layer described in FIGS. 1 and 2, there are possible other asymmetric low confinement structures according to the invention.

Figure 4:
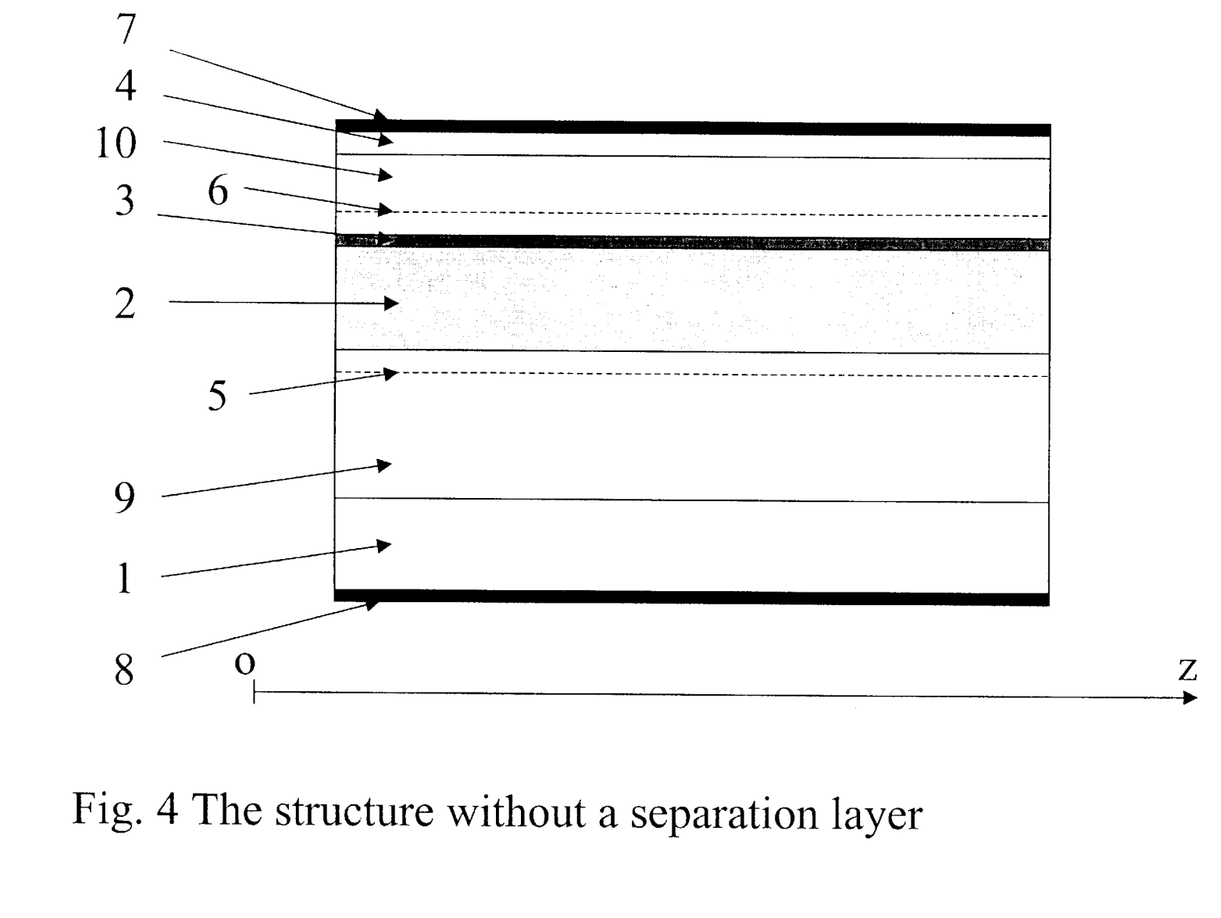
FIG. 4 The structure without a separation layer
Figure 5:
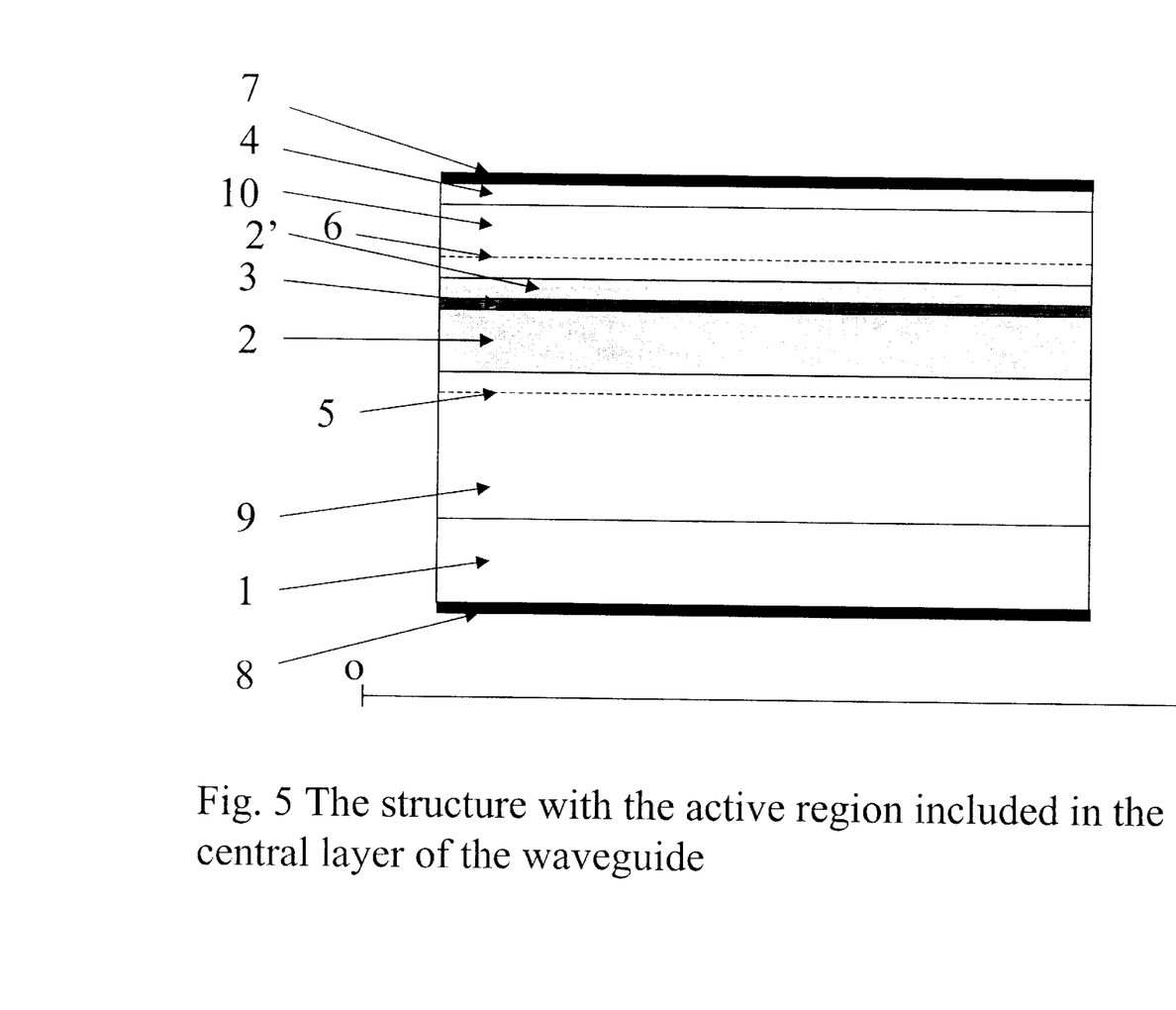
FIG. 5 The structure with the active region included in the central layer of the waveguide FIG. 6 The etching and the regrowth of the confinement layers 10'p and 10'n

In FIG. 4 is described a multilayer structure without the separation layer, wherein the active region 3 is asymmetrically positioned compared with the waveguide, at the extremity closer to the final contact 4 of the central layer 2. In FIG. 5 is described a multilayer structure wherein the active region is included in the central, layer 2, at the extremity closer to the final contact 4. All these structures are characterized by the fact that due to asymmetrical construction and due the selection of the optical and geometrical properties of the composing layers, the maximum of the radiation field distribution is attracted toward the middle of the central layer 2 and removed from the active region 3, where the radiation is produced. The selection of radiation distribution toward the central region 2 by the optical wall that might be built from or inside the final contact confinement layer 10.

In table 3 a layered structure without a separation layer, obtained from materials in the $Al_xGa_{1-x}as$ system is presented, while in table 4 a layered structure without a separation layer, obtained from materials in the InGaAsP system is presented. By the process of the etching and of the regrowth of confinement layers 10', $Al_{0.40}Ga_{0.60}As$ and respectively $In_{0.49}Ga_{0.51}P$. Identical with the etched confinement layers 10, layered structures are obtained for which the distribution for the field radiation have overlapping coefficients of 0.9980 and respectively 0.9970, while the effective refractive propagation indexes are changed from 3.3735 to 3.3709, and respectively from 3.2304 to 3.2235.

TABLE 3

| No | Name | No in text | Composition index, x | Thickness ($\mu$m) | Refractive index | Confinement factor (%) |
|---|---|---|---|---|---|---|
| 1 | substrate | 1 | 0.00 | 100 | 3.64 | |
| 2 | confinement | 9 | 0.40 | 1.50 | 3.35 | |
| 3 | central | 2 | 0.30 | 0.27 | 3.42 | |
| 4 | active | 3 | 0.00 | 0.01 | 3.64 | 1.64 |
| 5 | confinement | 10 | 0.40 | 1.50 | 3.42 | |
| 6 | final contact | 4 | 0.00 | 0.10 | 3.64 | |

TABLE 4

| No | Name | No in text | Composition | Gap $E_g$ (eV) | Thickness ($\mu$m) | Refractive index | Confinement factor (%) |
|---|---|---|---|---|---|---|---|
| 1 | substrate | 1 | GaAs | 1.43 | 0.00 | 3.55 | |
| 2 | confinement | 9 | $In_{0.49}Ga_{0.51}P$ | 1.90 | 1.50 | 3.20 | |
| 3 | central | 2 | InGaAsP | 1.77 | 0.35 | 3.27 | |
| 4 | active | 3 | $In_{0.2}Ga_{0.8}As$ | 1.26 | 0.01 | 3.70 | 1.46 |
| 5 | confinement | 10 | $In_{0.49}Ga_{0.51}P$ | 1.90 | 1.50 | 3.20 | |
| 6 | final contact | 4 | GaAs | 1.43 | 0.10 | 3.55 | | te optical and geometrical properties refers to the magnitude of the bumps of these two regions relative to the greatest value of the refractive index n of the substrate confinement layer 9, and to the repelling of the maximum of the field In table 5 a layered structure with the active region included in the central waveguide layer, obtained from materials in the $Al_xGa_{1-x}as$ system, is presented, while in the table 6 a layered structure with the active region included in the central waveguide layer, obtained from materials in the InGaAsP system, is presented. The central waveguide layer 2, continues on the other side of the active region with the central waveguide layer 2'. By the process of etching and the regrowth of $Al_{0.40}Ga_{0.60}As$ and respectively in $In_{0.49}Ga_{0.51}P$ confinement layers 10, identical with the etched confinement layers 10, structures are obtained for which the distribution functions of the field radiation have overlapping coefficients 0.9950 and respectively 0.9904, while the effective refractive propagation indexes are changed from 3.3758 to 3.3688 and respectively from 3.2317 to 3.293.

effective refractive propagation index is $n_s$, while in the external adjacent regions, the effective refractive propagation index is $n_{ad}$. For the structure in the table 1, if the confinement layer 10' is identical with the confinement layer 10, the mentioned effective refractive indexes are $n_s$=3.3716 and $n_{ad}$=3.3688. The difference between these two effective refractive indexes is 0.0028. The confinement layer 10' can have a composition and a refractive index adjusted to the stripe width, the stripe being designed for the operation in the fundamental lateral mode. The adjusted values are a little

TABLE 5

| No | Name | No in text | Composition index, x | Thickness ($\mu$m) | Refractive index | Confinement factor (%) |
|---|---|---|---|---|---|---|
| 1 | substrate | 1 | 0.00 | 100 | 3.64 | |
| 2 | confinement | 9 | 0.40 | 1.50 | 3.35 | |
| 3 | central | 2 | 0.30 | 0.25 | 3.42 | |
| 4 | active | 3 | 0.00 | 0.01 | 3.64 | 1.80 |
| 5 | central | 2' | 0.30 | 0.02 | 3.42 | |
| 6 | confinement | 10 | 0.40 | 1.50 | 3.35 | |
| 7 | final contact | 4 | 0.00 | 0.10 | 3.64 | |

TABLE 6

| No | Name | No in text | Composition | Gap $E_g$ (eV) | Thickness ($\mu$m) | Refractive index | Confinement factor (%) |
|---|---|---|---|---|---|---|---|
| 1 | substrate | 1 | GaAs | 1.43 | 100 | 3.55 | |
| 2 | confinement | 9 | $In_{0.49}Ga_{0.51}P$ | 1.90 | 1.50 | 3.20 | |
| 3 | central | 2 | InGaAsP | 1.77 | 0.30 | 3.27 | |
| 4 | active | 3 | $In_{0.2}Ga_{0.8}As$ | 1.26 | 0.01 | 3.70 | 1.76 |
| 5 | central | 2' | InGaAsP | 1.77 | 0.05 | 3.27 | |
| 6 | confinement | 10 | $In_{0.49}Ga_{0.51}P$ | 1.90 | 1.50 | 3.20 | |
| 7 | final contact | 4 | GaAs | 1.43 | 0.10 | 3.55 | |

For the structures presented in tables 1 . . . 6, the overlapping coefficients for the distribution functions of the initial structures and modified structures are very close to one, in the limit of one percent. Also, the refractive effective indexes are very close to each others, the differences being smaller than 1%.

Figure 6:
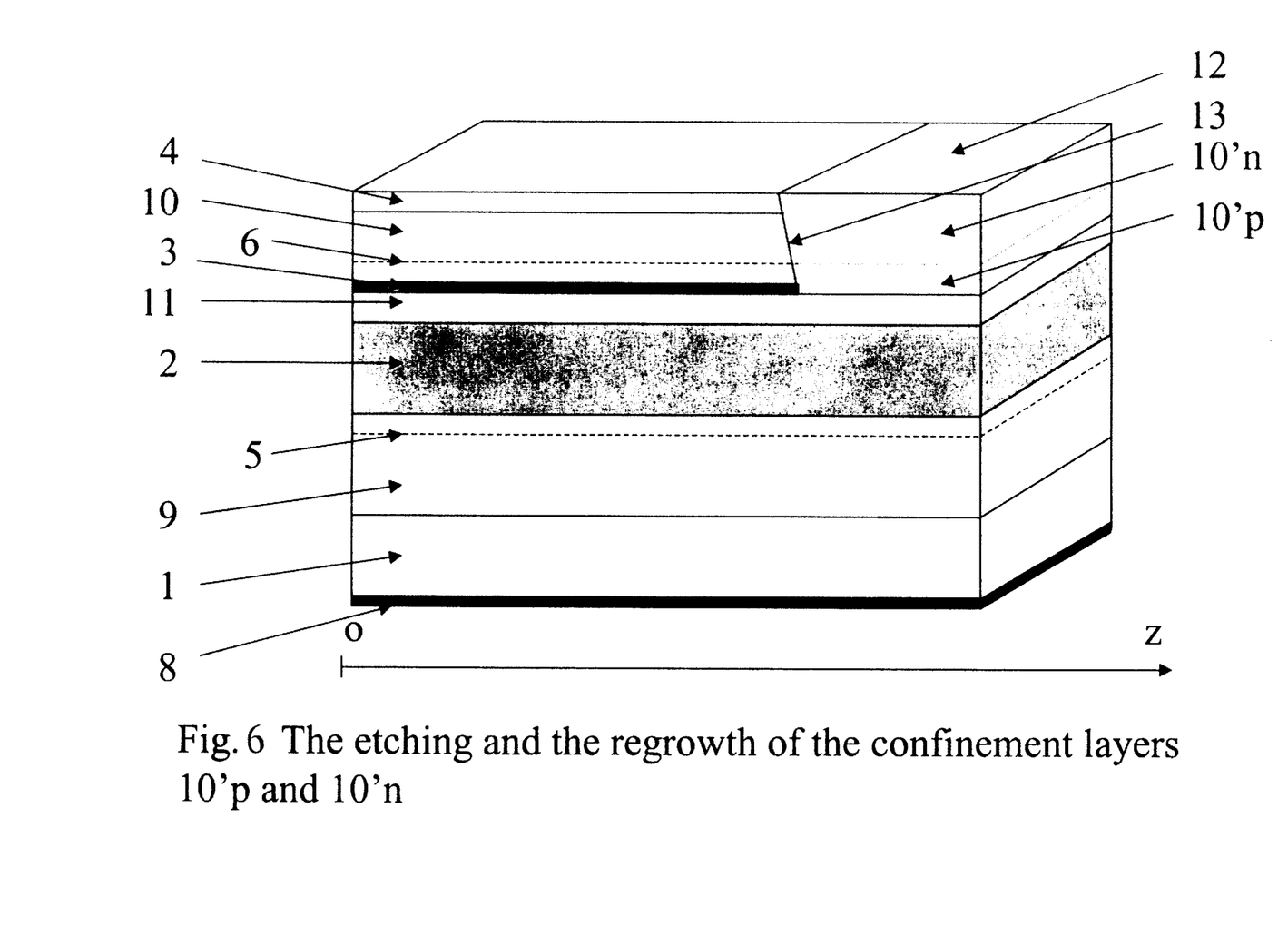

In the simplest case, that described in the tables 1 . . . 6, the etched layers have 1 been replaced by a single regrown layer 10', homogeneous from the conductivity type point of view. In FIG. 6 is shown a first extension of the invention. The regrown layer can be divided into two sublayers 10'p and 10'n, among which one has the p type conductivity while the other has the n type conductivity. The formed p-n junction will be reverse biased when the diode laser is directly biased. The closer the new formed p-n junction is to the former level of the injection interface 6, now etched, the better. In this way, by the formation in the regrowth processes of a reverse biased p-n junction the electrical isolation is obtained in the zone, etched and regrown, that did not contain any more the active region.

Another extension of the invention refers to the etching of the etching stripe for the window formation simultaneously with the formation by etching of a longitudinal stripe in which the propagation is in the fundamental mode. The formation of the longitudinal stripe is done by the etching of some layers, adjacent to the stripe, the same as those etched in the window etching stripe, followed by regrowth of the confinement layer 10'. By this process, inside the stripe the different from the values of the initial confinement layer 10, in order to produce an effective refractive index $n_{ad}$' closer to the $n_s$ value.

The stripe width d, which allows only the operation in the fundamental mode, depends on the confinement factor and on the modal gain. The smaller are the confinement factor and the modal gain, the weaker are the self focusing and filament formation processes and the filament dimensions are greater. For example, the structures with a confinement factor equal to 1% can operate its stripes having the width d equal to 10 $\mu$m, approximately equal to the dimension of the filaments formed by self focusing.

If between the stripe width d and the effective refractive indexes $n_s$, $n_{ad}$ there is a relation of the type:

$$d(n_s^2-n_{ad}^2)^{1/2}=k\lambda$$

where k is approximately 0.7–0.8, then, in the lateral direction, the fundamental lateral mode is well localized inside the stripe, the first order mode 1 has great lateral losses and the second order mode is cut off. For a stripe 10 $\mu$m side and the wavelength 0.85 $\mu$m, the precedent condition imposes that the difference between the effective refractive indexes to be adjusted to 0.0005–0.0006. Such a difference can be obtained if the refractive index of the layer 10' is adjusted to 3.357, i.e. the composition index of the regrown layer 10' is 0.39, instead of the composition index of the initial confinement layer 10, which was 0.40. The overlapping integral decreases from 0.9989 to 0.9988.

In this way, by etching the stripes for window formation simultaneously with the regions adjacent to the longitudinal stripe, and by the regrowth of a confinement layer with selected properties, a preselected difference for the effective refractive indexes of the longitudinal stripe and of the adjacent regions is obtained, which will assure the stripe operation in the fundamental lateral mode.

In another example is presented a structure in which the confinement layer 10 has a refractive index smaller than the refractive index of the confinement layer 9, so that the mentioned optical wall effect is obtained.

The example will be built with materials from the $Al_xGa_{1-x}as$ and is presented in table 7. Due to the optical wall effect, the confinement factor is reduced to 0.75%. A diode laser with a reduced confinement factor can operate with a reduced modal gain, so that the stripe width, adjusted to the dimension of the self focusing filaments, can be greater. For a stripe 15 μm wide, the difference between the effective refractive indexes of the longitudinal stripe and of the adjacent regions, in order to assure the operation in the fundamental lateral mode, needs to be 0.00035–0.00045, what can be obtained by a proper selection of the composition index of the regrown confinement layer 10'. For the structure in the table 7, if the regrown confinement layer 10' is identical with the etched confinement layer 10, the difference between the effective refractive indexes of the longitudinal stripe and of the adjacent regions is 0.0018. If the composition index of the regrown confinement layer 10' is adjusted to 0.53 and the refractive index of the regrown confinement layer is adjusted to 3.26, then the difference between the effective refractive indexes is 0.0004 and the operation in the fundamental lateral mode for a 15 μm wide stripe can be obtained.

In another example will be presented a structure wherein the separation layer 12 has a refraction index lower than the refractive indexes of the confinement layers 9 and 10. In this case the separation layer acts as a light barrier. The structures with the separation layer as a light barrier have the confinement factor smaller than the structures where the separation layer has the same refraction index as the confinement layers 9 and 10.

In table 8 such an example, with a separation layer that act as a light barrier, built from materials in the $Al_xGa_{1-x}as$ system is presented. This structure has also a low confinement factor, of 0.7%, which can operate with a low modal gain. The stripe width, adjusted to the dimensions of the filaments formed by self focusing, can be larger. For a stripe 15 μm wide, the difference between the effective refractive indexes of the longitudinal stripe and of the adjacent regions, in order to assure the operation in the fundamental lateral mode, needs to be 0.00035–0.00045. This difference can be obtained if the confinement layer 10' has an adjusted composition index equal to 0.387 and a refractive index adjusted to 3.359.

TABLE 8

| No | Name | No in text | Composition index, x | Thickness (μm) | Refractive index | Confinement factor (%) |
|---|---|---|---|---|---|---|
| 1 | substrate | 1 | 0.00 | 100 | 3.64 | |
| 2 | confinement n | 9 | 0.40 | 1.50 | 3.35 | |
| 3 | central | 2 | 0.30 | 0.25 | 3.42 | |
| 4 | separation | 11 | 0.50 | 0.10 | 3.28 | |
| 5 | active | 3 | 0.00 | 0.01 | 3.64 | 0.70 |
| 6 | confinement p | 10 | 0.40 | 1.50 | 3.35 | |
| 7 | final contact | 4 | 0.00 | 0.10 | 3.64 | |

The optical wall effect or the light barrier effect, induced by the separation layer, have as a result a pronounced reduction of the confinement factor. These effects can be utilized to compensate for the increase in the confinement factor if the construction of a diode laser with a wider active region is desirable, which can allow the optimal operation at high current densities, in pulsed regime.

By the separation or combined action of the asymmetric structure, of the optical wall and of optical barrier, structures with very low confinement factors can be obtained. The invention refers in special to structures with confinement factor smaller than 2%, values low compared with values of the usual diode laser structures.

The presented examples punctually represent a few of the possibilities to construct windows to the diode laser according to the invention and of the possibilities to obtain longitudinal stripes with optical properties adequate for the operation in the fundamental, lateral mode. All examples were based on etch—regrowth process as the method to obtain window regions. This method is considered to be the most radical one for modifying a layered structure. The asymmetrical initial structures and their low confinement

TABLE 7

| No | Name | No in text | Composition index, x | Thickness (μm) | Refractive index | Confinement factor (%) |
|---|---|---|---|---|---|---|
| 1 | substrate | 1 | 0.00 | 100 | 3.64 | |
| 2 | confinement n | 9 | 0.40 | 2.00 | 3.35 | |
| 3 | central | 2 | 0.30 | 0.27 | 3.42 | |
| 4 | active | 3 | 0.00 | 0.01 | 3.64 | 0.76 |
| 5 | confinement p | 10 | 0.60 | 1.50 | 3.21 | |
| 6 | final contact | 4 | 0.00 | 0.10 | 3.64 | | factor assure the efficiency of the method toward obtaining high values for the overlapping coefficient and a growth transition from the waveguide of the main path of the diode laser toward its window waveguide.

In the practical accomplishment of the invention, a rigorous technological control of the etching depth is important. In order to ease this control, one of the physical or chemical properties, sensitive to the layer composition can be utilized as an indicator, including the slowing down of the etching for a certain composition. The etching is stopped or continues under control, from the moment when a preselected value for the etching indicator has been attained.

In the practical accomplishment of the invention is also important that the interface 13 to be as clean as possible. This condition can be obtained if the etching processes are done by the liquid epitaxy processes, from Ga, In or other metals solutions.

I claim:

1. A diode laser comprising:
    an asymmetric low confinement waveguide including several semiconductor layers each having selected optical properties;
    an active region in the layers where the radiation generation is produced;
    said active region being located asymmetrically relative to the waveguide and at an extremity of a waveguide central layer, said layers being constructed to accept only a fundamental transversal mode wavelength by restricting the sum of bump magnitudes of the waveguide central layer and of the active region to less than $\lambda/4$;
    said layered structure having a confinement factor for the active region which is less than 2% which is formed by attracting the maximum of the radiation field distribution toward the middle of the waveguide central layer, said waveguide central layer having a bump magnitude which is much larger than the bump magnitude of the active region and by pushing the maximum of the radiation field distribution away from the active region as a result of an optical wall built from or in a final contact confinement layer;
    said diode laser having a window region with a window waveguide having an adequate crystalline structure which is nonabsorbing for the radiation emitted by the laser;
    whereby, in the window waveguide, the maximum of the radiation field distribution is attracted toward the middle of the central layer such that the optical properties of the window waveguide assure an overlapping coefficient for the two waveguides, the window waveguide and the rest of the diode laser waveguide, which is greater than 98% to provide propagation up to a mirror into a window waveguide similar to the waveguide defined in the rest of the diode laser.

2. The diode laser of claim 1 including a p-n reverse biased junction in the reconstructed window region the assure the electrical isolation of this region.

3. The diode laser of claim 1 wherein said window region stripes are formed simultaneously with the formation of lateral regions adjacent to the longitudinal diode laser stripe which have a preselected variation of the difference of an effective refractive region between said diode laser stripe and adjacent regions in order to ensure operation of the longitudinal diode strip in the fundamental lateral mode.

4. A diode laser comprising:
    an asymmetric low confinement waveguide including several semiconductor layers each having selected optical properties;
    an active region in the layers where the radiation generation is produced;
    said active region being located asymmetrically relative to the waveguide and at an extremity of a waveguide central layer, said layers being constructed to accept only a fundamental transversal mode wavelength by restricting the sum of bump magnitudes of the waveguide central layer and of the active region to less than $\lambda/4$;
    said layered structure having a confinement factor for the active region which is less than 2% which is formed by attracting the maximum of the radiation field distribution toward the middle of the waveguide central layer, said waveguide central layer having a bump magnitude which is larger than the bump magnitude of the active region;
    said diode laser having a window region in which the radiation is propagating into a window waveguide toward an exit mirror, the window region being designed in stripes located perpendicular to the direction of propagation, in said window region a large portion of the initial layered structure is unaffected and a portion containing the active region is replaced with a material having a sufficient crystalline structure which is nonabsorbing for the radiation emitted by the laser;
    whereby the maximum of the radiation field distribution in the window waveguide is attracted toward the middle of the central layer such that the optical properties of the window waveguide assure an overlapping coefficient for two waveguides, the window waveguide and the rest of the diode laser waveguide, which is as close to one as 98% or better, providing a propagation up to an exit mirror into a waveguide similar to the waveguide defined by the rest of the diode laser.

5. The diode laser of claim 4 wherein the attraction of the maximum of the radiation field distribution toward the middle of the waveguide central is enhanced by pushing the maximum of the radial field distribution away from the active region as a result of an optical wall built from or in a final contact confinement layer.

6. The diode laser of claim 4 including a -n reverse biased junction in the reconstructed window region to assure he electrical isolation of this region.

7. The diode laser of claim 4 wherein said window region stripes are formed simultaneously with the formation of lateral regions adjacent to the longitudinal diode laser stripe which have a preselected variation of the difference of an effective refractive region between said diode laser stripe and adjacent regions in order to ensure operation of the longitudinal diode stripe in the fundamental lateral mode.

8. A method for forming a diode laser comprising the steps of:
    creating low confinement waveguide in a asymmetric manner comprising several semiconductor layers each having selected optical properties;
    providing an active region in the layers where the radiation generation is produced;
    locating said active region asymmetrically relative to the waveguide and at an extremity of a waveguide central layer, said layers being constructed to accept only a fundamental transversal mode wavelength by restricting the sum of bump magnitudes of the waveguide central layer and of the active region to less than $\lambda/4$;

providing the layered structure with a confinement factor for the active region which is less than 2% by attracting the maximum of the radiation field distribution toward the middle of the waveguide central layer, said waveguide central layer having a bump magnitude which is much larger than the bump magnitude of the active region and, possibly, by pushing the maximum of the radiation field distribution away from the active region as a result of an optical wall built from or in a final contact confinement layer;

forming a window with a window waveguide in the layered diode laser by reconstruction with a material with an adequate crystalline structure which is nonabsorbing for the radiation emitted by the laser;

whereby, as a result of the reconstruction process, the maximum of the radiation field distribution is attracted toward the middle of the central layer such that the optical properties of the window waveguide assure an overlapping coefficient for the two waveguides, the window waveguide and the rest of the diode laser waveguide, which is greater than 98% to provide propagation up to a mirror into a window waveguide similar to the waveguide defined in the rest of the diode laser.

9. The method of claim 8 wherein a p-n reverse biased junction is formed in a regrowth step to assure electrical isolation of the zone of the regrowth where the active region is missing.

10. The method of claim 8 wherein the step of forming stripes to create the windows is performed simultaneously with a regrowth of a confinement layer with selected properties to obtain a preselected variation of the difference of effective refractive indexes of the longitudinal strip and of the adjacent region in order to ensure operation of the longitudinal strip in the fundamental lateral mode.

11. The method of claim 8 wherein said step of reconstruction is accomplished with a regrowing of the material with the desired crystalline structure and the steps of etching and regrowth are obtained utilizing liquid phase epitaxy from metal solutions including one of Ga or In.

12. The method of claim 8 including the step of controlling the etching by stopping or continuing the etching in a controlled manner when an etching indicator established in connection with a physical or chemical property of the etched layer has attained a preselected value.

* * * * *

UNITED STATES PATENT AND TRADEMARK OFFICE
CERTIFICATE OF CORRECTION

PATENT NO.    : 6,272,161 B1                                    Page 1 of 1
DATED         : August 7, 2001
INVENTOR(S)   : Iulian Basarab Petrescu-Prahova It is certified that error appears in the above-identified patent and that said Letters Patent is hereby corrected as shown below:

<u>Title page,</u>
Item [76], please change the name of the inventor from "Iuliah Basarab Petrescu-Prahova" to -- Iulian Basarab Petrescu-Prahova --

Signed and Sealed this

Twenty-second Day of October, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO. : 6,272,161 B1
DATED : August 7, 2001
INVENTOR(S) : Iuliah Basarab Petrescu-Prahova It is certified that error appears in the above-identified patent and that said Letters Patent is hereby corrected as shown below:

<u>Title page,</u>
Item [76], please change the name of the inventor from "Iuliah Basarab Petrescu-Prahova" to -- Iulian Basarab Petrescu-Prahova --

Signed and Sealed this

Twenty-ninth Day of October, 2002

*Attest:*

JAMES E. ROGAN
*Attesting Officer*    *Director of the United States Patent and Trademark Office*